US012392754B2

(12) United States Patent
Ballandras et al.

(10) Patent No.: US 12,392,754 B2
(45) Date of Patent: Aug. 19, 2025

(54) DIFFERENTIAL ACOUSTIC WAVE SENSORS

(71) Applicant: Soitec, Bernin (FR)

(72) Inventors: Sylvain Ballandras, Besançon (FR); Emilie Courjon, Franois (FR); Florent Bernard, Besançon (FR); Thierry LaRoche, Besançon (FR); Julien Garcia, Chamblay (FR)

(73) Assignee: Soitec, Bernin (FR)

(*) Notice: Subject to any disclaimer, the term of this patent is extended or adjusted under 35 U.S.C. 154(b) by 528 days.

(21) Appl. No.: 17/753,508

(22) PCT Filed: Sep. 4, 2020

(86) PCT No.: PCT/EP2020/074865
§ 371 (c)(1),
(2) Date: Mar. 4, 2022

(87) PCT Pub. No.: WO2021/044031
PCT Pub. Date: Mar. 11, 2021

(65) Prior Publication Data
US 2022/0341881 A1    Oct. 27, 2022

(30) Foreign Application Priority Data

Sep. 4, 2019    (FR) ........................................ 1909734

(51) Int. Cl.
G01N 29/22    (2006.01)
G01K 11/26    (2006.01)
(Continued)

(52) U.S. Cl.
CPC ......... *G01N 29/222* (2013.01); *G01K 11/265* (2013.01); *G01N 29/022* (2013.01);
(Continued)

(58) Field of Classification Search
CPC ............... G01N 29/222; G01N 29/022; G01N 29/2462; G01N 2291/0256;
(Continued)

(56) References Cited

U.S. PATENT DOCUMENTS 3,062,402 A    11/1962    Farrell et al.
5,200,633 A    4/1993    Dickert et al.
(Continued)

FOREIGN PATENT DOCUMENTS

CN    104768113 B    5/2018
DE    102015106463 A1    10/2016
(Continued)

OTHER PUBLICATIONS

Machine translation of CN104768113 (Year: 2015).*
(Continued)

*Primary Examiner* — Stephen D Meier
*Assistant Examiner* — Quang X Nguyen
(74) *Attorney, Agent, or Firm* — TraskBritt

(57) ABSTRACT

An acoustic wave sensor device, comprising an interdigitated transducer; a first reflection structure arranged on one side of the interdigitated transducer, and a second reflection structure arranged on another side of the interdigitated transducer; a first resonance cavity comprising a first upper surface and formed between the interdigitated transducer and the first reflection structure; a second resonance cavity comprising a second upper surface and formed between the interdigitated transducer and the second reflection structure; and wherein the second upper surface comprises a physical and/or chemical modification as compared to the first upper surface.

18 Claims, 14 Drawing Sheets

(51) Int. Cl.
*G01N 29/02* (2006.01)
*G01N 29/24* (2006.01)
*H03H 9/02* (2006.01)
*H03H 9/145* (2006.01)
*H03H 9/25* (2006.01)

(52) U.S. Cl.
CPC ..... *G01N 29/2462* (2013.01); *H03H 9/02551* (2013.01); *H03H 9/02559* (2013.01); *H03H 9/02574* (2013.01); *H03H 9/02842* (2013.01); *H03H 9/145* (2013.01); *H03H 9/25* (2013.01); *G01N 2291/0256* (2013.01); *G01N 2291/0423* (2013.01); *G01N 2291/101* (2013.01)

(58) Field of Classification Search
CPC ..... G01N 2291/0423; G01N 2291/101; G01K 11/265; H03H 9/02551; H03H 9/02559; H03H 9/02574; H03H 9/02842; H03H 9/145; H03H 9/25
See application file for complete search history.

(56) References Cited

U.S. PATENT DOCUMENTS

| | | | |
|---|---|---|---|
| 5,221,870 | A | 6/1993 | Nakahata et al. |
| 6,316,861 | B1 | 11/2001 | Ballandras et al. |
| 10,589,878 | B2 | 3/2020 | Veto et al. |
| 2002/0079987 | A1* | 6/2002 | Yip ............... H03H 9/14541 333/195 |
| 2002/0166955 | A1 | 11/2002 | Ogawa |
| 2003/0020367 | A1* | 1/2003 | Maeda ............... H03H 3/08 310/313 D |
| 2006/0049714 | A1 | 3/2006 | Liu et al. |
| 2008/0116361 | A1 | 5/2008 | Sanders et al. |
| 2009/0282902 | A1 | 11/2009 | Warthoe |
| 2015/0000414 | A1* | 1/2015 | Yoshimura ......... G01H 11/08 73/649 |
| 2016/0286311 | A1* | 9/2016 | Hatakeyama ........ H03H 9/25 |
| 2017/0052174 | A1* | 2/2017 | Branch ........... B01L 3/502715 |
| 2017/0288629 | A1* | 10/2017 | Bhattacharjee .... H03H 9/02275 |
| 2020/0284763 | A1* | 9/2020 | Lamothe ............ G01N 29/022 |

FOREIGN PATENT DOCUMENTS

| | | | |
|---|---|---|---|
| EP | 0998037 | A1 | 5/2000 |
| EP | 1097053 | B1 | 5/2004 |
| EP | 2212145 | B1 | 4/2012 |
| EP | 2418482 | B1 | 3/2017 |
| EP | 2799860 | B1 | 10/2017 |
| EP | 2871474 | B1 | 3/2018 |
| EP | 3421864 | B1 | 1/2020 |
| JP | 64-500052 | A | 1/1989 |
| JP | 01-214719 | A | 8/1989 |
| JP | 03-100457 | A | 4/1991 |
| JP | 2000-151352 | A | 5/2000 |
| JP | 2002-272737 | A | 9/2002 |
| JP | 2003-169801 | A | 6/2003 |
| JP | 2007-142794 | A | 6/2007 |
| JP | 2007-232707 | A | 9/2007 |
| JP | 2008-129020 | A | 6/2008 |
| JP | 2008-224582 | A | 9/2008 |
| JP | 2008-267968 | A | 11/2008 |
| JP | 2009-062170 | | 3/2009 |
| JP | 2009-222589 | A | 10/2009 |
| JP | 2009-300302 | A | 12/2009 |
| JP | 2010-501067 | A | 1/2010 |
| JP | 2016-038241 | A | 3/2016 |
| JP | 2019-161634 | A | 9/2019 |
| JP | 2020-077927 | A | 5/2020 |
| WO | 00/05090 | A1 | 2/2000 |
| WO | 2009/051526 | A1 | 4/2009 |
| WO | 2010/041390 | A1 | 4/2010 |
| WO | WO-2015158912 | A1 * | 10/2015 ........... G01K 11/265 |
| WO | 2016/137009 | A1 | 9/2016 |
| WO | 2016/173586 | A1 | 11/2016 |

OTHER PUBLICATIONS

Japanese Notice of Reasons for Refusal for Application No. 2023-512318 dated Jul. 22, 2024, 2 pages.
European Communication pursuant to Article 94(3) EPC for European Application No. 20775821.0, dated May 7, 2024, 5 pages.
Japanese Notice of Reasons for Rejection for Application No. 2023-512318 dated Jan. 11, 2024, 5 pages.
French Search for Application No. 1909734 on Sep. 4, 2022, 17 pages translated.
International Search Report for Application No. PCT/EP2020/074865 dated Nov. 19, 2020, 4 pages.
International Written Opinion for Application No. PCT/EP2020/074865 dated Nov. 19, 2020, 6 pages.
Schwelb, Otto, Axial Modes of Acoustically Coupled Surface Acoustic Wave Fabry-Perot Resonators, Journal of Applied Physics, vol. 68, (Jul. 15, 1990), pp. 474-481.
Japanese Decision to Grant a Patent for Japanese Application No. 2022-512797, dated Oct. 3, 2023, 6 pages with English translation.
Japanese Notice of Reasons for Refusal for Japanese Application No. 2022-512797, dated May 23, 2023, 18 pages with English translation.

* cited by examiner

DIFFERENTIAL ACOUSTIC WAVE SENSORS

CROSS-REFERENCE TO RELATED APPLICATIONS

This application is a national phase entry under 35 U.S.C. § 371 of International Patent Application PCT/EP2020/074865, filed Sep. 4, 2020, designating the United States of America and published as International Patent Publication WO 2021/044031 A1 on Mar. 11, 2021, which claims the benefit under Article 8 of the Patent Cooperation Treaty to French Patent Application Serial No. FR1909734, filed Sep. 4, 2019.

TECHNICAL FIELD

The present disclosure relates to sensors of the acoustic wave type and, in particular, differential acoustic wave sensors comprising resonance cavities.

BACKGROUND

Sensors are of growing importance and becoming more and more ubiquitous in every-day life. Microelectromechanical systems (MEMS) are an attractive option to answer the demand for increased performance of sensors along with decreased sizes and costs. Surface acoustic wave (SAW) sensors, and to a lower extent bulk acoustic wave (BAW) sensors or Lamb wave or Love wave acoustic sensors, offer particularly advantageous options due to a wide variety of measurable ambient parameters including temperature, pressure, strain and torque, for example.

Acoustic wave sensors utilize the piezoelectric effect to transduce an electrical signal into a mechanical/acoustic wave. SAW-based sensors are built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate such as, for instance, silicon, if necessary by means of a bonding layer, such as, for instance, a silicon oxide layer (in general, any combination of a single crystal piezoelectric material with non-piezoelectric substrates can be used in view of their specific properties like thermo-elastic properties or acoustic quality).

A transducer, in the case of a surface acoustic wave sensor, an interdigitated transducer (IDT), converts the electrical energy of the electrical signal into acoustic wave energy. The acoustic wave travels across the surface (or bulk) of a device substrate via the so-called delay line to another transducer, in particular, an IDT, that converts the acoustic wave back to an electrical signal that can be detected. In some devices mechanical absorbers and/or reflectors are provided in order to prevent interference patterns and reduce insertion loss. In some devices the other (output) IDT is replaced by a reflector that reflects the generated acoustic wave back to the (input) IDT that can be coupled to an antenna for remote interrogation of the sensor device. Advantageously, the measurements can be performed completely passively, i.e., the sensor need not be powered by a power source.

A particular class of acoustic wave sensors comprises resonators exhibiting resonance frequencies that vary according to varying ambient conditions. FIG. 1 illustrates an example of a resonant acoustic wave sensor. The surface acoustic wave resonator comprises an electroacoustic interdigitated transducer IDT with interdigitated comb electrodes C and C' arranged between Bragg mirrors M. The comb electrodes are set at opposite potentials +V and −V, respectively. The electrode geometry is defined by the pitch p, i.e., the spatial repetition frequency of the interleaved electrodes C and C' in the direction of the propagation of the excited surface acoustic waves, the lengths of the gaps between the electrodes C and C' in the direction perpendicular to the direction of the propagation of the excited surface acoustic waves, the lengths of the acoustic aperture region given by the lengths of the electrodes C and C' between the gaps and the widths a of the electrodes C and C' determining the so-called metallization ratio. The IDT can operate at Bragg conditions at which the wavelength $\lambda$ of the excited surface acoustic wave equals twice the pitch p, for example.

At the resonance frequency, the condition of synchronism between the reflectors is satisfied thereby allowing to obtain a coherent addition of the different reflections that occur under the reflectors. A maximum of acoustic energy is then observed within the resonant cavity and, from an electrical point of view, a maximum of amplitude of the current admitted by the transducer is observed. In principle, differential acoustic wave sensors may comprise two or more resonators exhibiting different resonance frequencies or a resonator working in multimode (several resonance frequencies), wherein differences in the measured frequencies reflect variations in the ambient parameters that is to be measured (the measurand) as, for example, temperature or strain.

However, despite the recent engineering process, the entire interrogation process wherein an interrogator transmits an appropriate radiofrequency signal that is received by the acoustic wave sensor via a reception antenna and converted by a transducer into a surface acoustic wave (or bulk wave, in the case of devices of a bulk acoustic wave sensor type) that is converted into a radiofrequency signal being re-transmitted via an emission antenna and received and analyzed by the interrogator still poses demanding technical problems. Particularly, radiofrequency noise present in the commonly used ISM (Industrial, Scientific, Medical) bands, for example, in bands with a center frequency of 434 MHz or 2.45 GHz, causes reading/interpretation errors affecting the quality of the generation and analysis of response spectra provided by the sensor devices.

True differential measurements based on an appropriate differential sensitivity of the resonances of the resonator(s) used to the measurand has to be accurately observed in order to obtain reliable measurement results. This poses severe demands for tolerances of the production processes and reproducibility of physical properties from one wafer to another. In addition, any relative motion between the sensor device and the interrogator can heavily affect the measurement results due to the RF link formed by the sensor device and the interrogator in an inductive or capacitive manner. Other environmental influence, for example, temperature changes, in the measurement environment also affect the reliability of the measurement results.

BRIEF SUMMARY

Therefore, it is an object of the present disclosure to provide an acoustic wave sensor that allows for an increased signal-to-noise ratio and more reliable measurement results as compared to the acoustic wave sensor devices of the art.

The present disclosure addresses the above-mentioned object by providing:
an acoustic wave sensor device, comprising:
an interdigitated transducer (comprising comb electrodes);
a first reflection structure arranged on one side of the interdigitated transducer;
a second reflection structure arranged on another side of the interdigitated transducer;
a first resonance cavity comprising a first upper surface and formed between the interdigitated transducer and the first reflection structure;
a second resonance cavity comprising a second upper surface and formed between the interdigitated transducer and the second reflection structure; and
wherein
the second upper surface comprises a physical and/or chemical modification as compared to the first upper surface.

The acoustic wave sensor device, moreover, may comprise a substrate comprising a piezoelectric layer and a non-piezoelectric bulk substrate or it may comprise a (uniform) piezoelectric substrate.

The physical and/or chemical modification may be applied to the entire second upper surface or a part of the same. Due to the modification of the second upper surface of the second resonance cavity the propagation characteristics of acoustic waves generated by the interdigitated transducer differ in the second resonance cavity from the ones in the first resonance cavity. Thereby, a very reliable and sensitive differential sensor device can be provided.

Without modification, the first and second upper surfaces are free (exposed) surfaces, particularly, free surfaces of a piezoelectric layer (see description below). The physical and/or chemical modification may be realized by forming a material layer on the second upper surface only or a material layer on the second upper surface and another material layer (which is made of a different material as compared to the material layer formed on the second upper surface) on the first upper surface.

According to an embodiment, the physical and/or chemical modification comprises a metallization layer formed on the second upper surface, wherein the metallization layer, for example, comprises or consists of at least one of AlCu and Ti. According to another embodiment, the physical and/or chemical modification comprises a passivation layer formed on the second upper surface. The passivation layer may be made of some dielectric material and, for example, comprises or consists of a nitride and/or oxide material and may, particularly, comprise or consist of at least one of $Si_3N_4$, $Al_2O_3$, AlN, $SiO_2$, and $Ta_2O_5$.

Alternatively or additionally, the physical and/or chemical modification may comprise a recess of the second upper surface with respect to the first resonance cavity (i.e., the second upper surface is positioned lower than the first one).

According to further embodiments, the first resonance cavity comprises another physical and/or chemical modification that is different from the one of the second resonance cavity. The first upper surface may be modified by the formation of a metallization layer or passivation layer on the first upper surface. In particular, the first upper surface may be modified by the formation of a passivation layer on the first upper surface and/or the formation of a recess of the first upper surface. In particular, the first upper surface may be modified by the formation of a metallization layer on the first upper surface and/or the formation of a recess of the first upper surface. All combinations of the named modifications or other ones of the first and second upper surfaces are envisaged as long as the modifications of the first and second upper surfaces differ from each other in order to guarantee different resonance characteristics of the first and second resonance cavity, respectively.

In all of the above-described examples, the first reflection structure may comprise or consist of a Bragg mirror (comprising elongated electrodes arranged in parallel to each other) and the second reflection structure may comprise or consist of another Bragg mirror (comprising other elongated electrodes arranged in parallel to each other). Thereby, a surface acoustic wave sensor device can readily be realized.

According to an alternative embodiment, in all of the above-described examples, the first reflection structure comprises or consists of an edge reflection structure. Thereby, a sensor employing pure shear waves can readily be realized. Particularly, this embodiment employing pure shear waves can be used for sensing ambient parameters in liquids.

Moreover, cascaded resonance cavities can be formed in the acoustic wave sensor device according to one of the above-described embodiments in order to reduce the number of resonances to arrive at unique measurement results. Thus, the acoustic wave sensor device according to one of the above-described examples may be configured such that the first resonance cavity comprises first sub-cavities separated from each other by first reflection sub-structures of the first reflection structure and the second resonance cavity comprises second resonance sub-cavities separated from each other by second reflection sub-structures of the second reflection structure. Each of the reflection sub-structures may consist of elongated electrodes arranged in parallel to each other.

The acoustic wave sensor device according to one of the above-described examples may be a POI device and, thus, may comprise a bulk substrate, in particular, a Si bulk substrate, a dielectric layer, in particular, an $SiO_2$ layer, formed on the bulk substrate and a piezoelectric layer, in particular, an $LiNbO_3$ or $LiTaO_3$ layer. In this case, the interdigitated transducer and the first and second reflection structures are formed on the upper surface of the piezoelectric layer and the first and second resonance cavities comprise the piezoelectric layer. The upper surface of the piezoelectric layer is physically and/or chemically modified in the second resonance cavity with respect to the first resonance cavity.

In all of the above-described embodiments, the extension lengths (in the direction of propagation of the acoustic waves) of the first resonance cavity and the second resonance cavity may differ from each other in order to more clearly separate the spectral responses of the resonances of the first resonance cavity and the second resonance cavity from each other.

According to particular embodiments, in all of the above-described examples, the interdigitated transducer may be split into two parts and the device may further comprise an additional reflection structure positioned between the two parts. Such a configuration is advantageous in operation situations in that the reflection coefficient of the transducer is not strong enough to allow for a clear enough separation between the resonances of the cavities.

In general, the acoustic wave sensor device according to one of the above-described examples may be a passive surface acoustic wave sensor device and/or the ambient parameter is one of a temperature, chemical species, strain, pressure or torque of a rotating axis.

Furthermore, it is provided a system for monitoring/measuring an ambient parameter, for example, a temperature, a strain level, a pressure or a torque level of a rotating axis, a chemical species, etc., that comprises an interrogation device and an acoustic wave sensor device according to one of the above-described embodiments that is communicatively coupled to the interrogation device.

The interrogation device for interrogating an acoustic wave sensor may comprise a transmission antenna configured for transmitting an interrogation radiofrequency signal to the acoustic wave sensor device, a reception antenna configured for receiving a response radiofrequency signal from the acoustic wave sensor device that may also comprise a transmission/reception antenna and a processing means for processing/analyzing the response radiofrequency signal in order to determine an ambient parameter that is to be sensed.

BRIEF DESCRIPTION OF THE DRAWINGS

Additional features and advantages of the present disclosure will be described with reference to the drawings. In the description, reference is made to the accompanying figures that are meant to illustrate preferred embodiments of the disclosure. It is understood that such embodiments do not represent the full scope of the invention.

DETAILED DESCRIPTION

Figure 1:
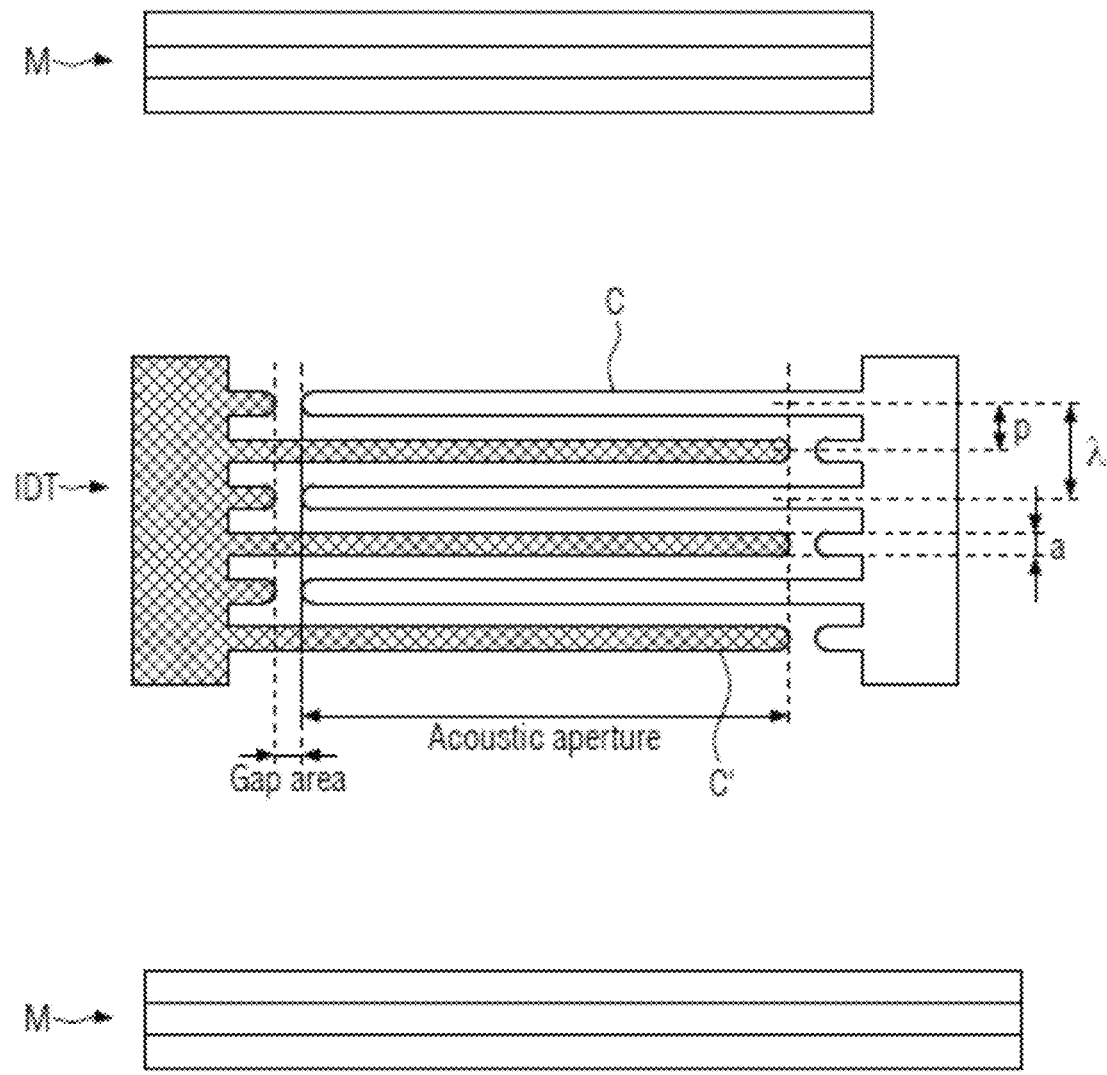
FIG. 1 represents an example of a surface acoustic wave sensor according to the art.

The present disclosure provides acoustic wave sensors, in particular, passive SAW sensors, that are characterized by a high signal-to-noise ratio, sensitivity and reliability. With respect to temperature measurements, for example, the obtainable resonance frequency sensitivity allows for a measurement sensitivity of more than 1 ppm per Kelvin. The acoustic wave sensors can be interrogated by any interrogators that are configured to determine a response spectrum from an interrogated acoustic wave sensor. The interrogated acoustic wave sensor can, for example, be a resonator device, for example, a differential SAW sensor. It goes without saying that the disclosure can be implemented in any devices employing acoustic wave sensors or dielectric resonators, RLC circuits, etc.

The interrogation device interrogating one of the inventive acoustic wave sensor devices may comprise a transmission antenna for transmitting an interrogation radiofrequency signal to the sensor device and a reception antenna for receiving a response radiofrequency signal from the sensor device. The interrogation radiofrequency signal transmitted by the transmission antenna may be generated by a signal generator that may comprise a radiofrequency synthesizer or oscillator as well as optionally some signal shaping module providing a suitable frequency transposition and/or amplification of the signal to be transmitted by the transmission antenna. The interrogation radiofrequency signal generated by the signal generator may be a pulsed or bursty signal with a frequency selected according to the resonance frequency of the acoustic wave sensor device.

Furthermore, the interrogation device may comprise a processing means connected to the reception antenna. The processing means may comprise filtering and/or amplification means and be configured for analyzing the response radiofrequency signal received by the reception antenna. For example, the sensor device operates at a resonance frequency of 434 MHz or 866 MHz or 915 MHz or 2.45 GHz (the said ISM bands).

The interrogation device may transmit a long radiofrequency pulse and after the transmission has been stopped, the resonance cavities of the sensor device discharge at their resonant eigenfrequencies with time constants $\tau$ equal to $Q_f/\pi F$ wherein F is the central frequency and $Q_f$ is the quality factor of the resonance, $Q_f$ corresponding to the ratio between the resonance central frequency and the width at half maximum of the band pass used in the interrogation process. Spectral analysis performed by the processing means of the interrogation device allows for calculating the resonator frequency(ies) and, thereby, the sensing of an ambient parameter. The received response radiofrequency signal may be mixed by the processing means with interrogation radiofrequency signal according to the so-called I-Q protocol as known in the art to extract the real and imaginary parts (in-phase components I=Y cos φ and quadrature components Q=Y sin φ with the signal amplitude Y and the phase φ) from which the modulus and phase can then be derived.

Figure 2:
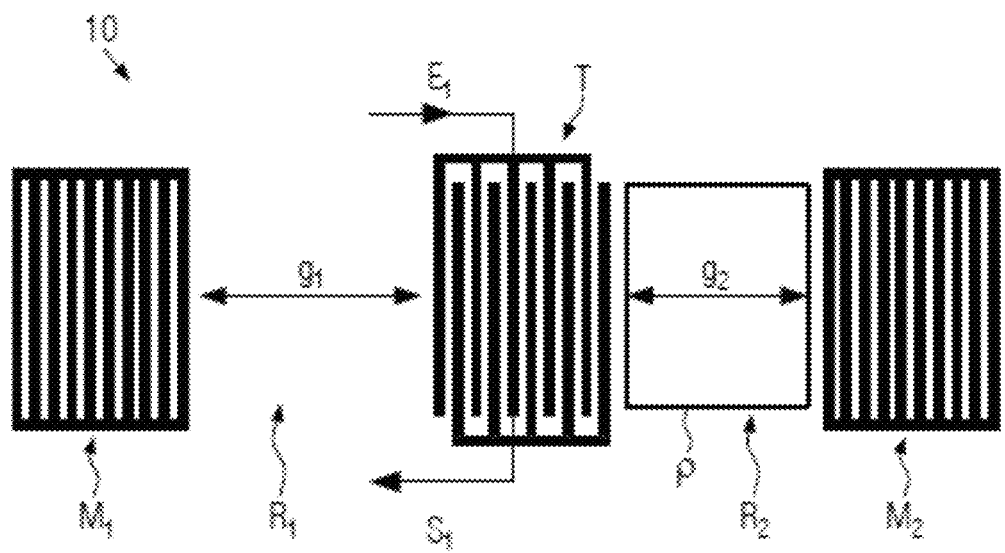
FIG. 2 represents a principle sketch illustrating an essential feature in form of a modified resonance cavity of an embodiment of an acoustic wave sensor device according to the present disclosure.

FIG. 2 illustrates an exemplary embodiment of an inventive surface acoustic wave (SAW) sensor device 10. The SAW sensor device 10 shown in FIG. 2 comprises an interdigitated (a comb) transducer T connected to an antenna (not shown in FIG. 2) for receiving an electromagnetic wave $E_1$ and converting the electromagnetic wave $E_1$ into a surface acoustic wave $S_1$. The comb transducer T comprises interdigitated electrodes as described with reference to FIG. 1, for example. Two SAW resonance cavities $R_1$ and $R_2$ with extensions (gaps) $g_1$ and $g_2$, respectively, are provided between the comb transducer T and Bragg mirrors $M_1$ and $M_2$, respectively. It is noted that here and in the following a sensor device comprising one transducer and two resonance cavities is described but more than one transducer and more than two resonance cavities may also be provided.

The sensor device 10 may comprise a SAW-based sensor built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate such as, for instance, silicon, if necessary by means of a bonding layer, such as, for instance, a silicon oxide layer. The transducer T converts an interrogation radiofrequency signal $E_1$ received by the antenna into a surface acoustic wave $S_1$ that is reflected back by the Bragg mirrors $M_1$ and $M_2$ of the resonance cavities $R_1$ and $R_2$ and converted back into a radiofrequency signal that in course is transmitted by the antenna (or another antenna) as a response radiofrequency signal. The surface acoustic wave sensor device 10 (as well as the devices described below with reference to other one of the figures) may operate at Bragg conditions with wavelengths of the excited surface acoustic waves of some multiples of the pitches of the comb electrodes of the comb transducer T. When operation is performed at Bragg conditions the comb transducer T itself substantially functions as a mirror (with a reflectivity of at least 80%) thereby definitely separating the resonance cavities $R_1$ and $R_2$ from each other.

According to the disclosure, the provided resonance cavities $R_1$ and $R_2$ differ from each other in that one of them ($R_2$ in the example shown in FIG. 2) exhibits some physical and/or chemical modification p as compared to the other one. By the physical and/or chemical modification p different propagation conditions and, thus, different resonance characteristics, are provided in the different resonance cavities $R_1$ and $R_2$. Multiple resonances according to multiple resonance cavities $R_1$ and $R_2$ and, thus, differential effects when comparing resonances characterizing each of the multiple resonance cavities $R_1$ and $R_2$ thereby arise.

There is a variety of means for providing the physical and/or chemical modification p in order to achieve propagating wave modes that exhibit differential parametric sensitivities. These means, for example, include realization of the physical and/or chemical modification p by the formation of a metallization layer and/or passivation layer.

Figure 3A:
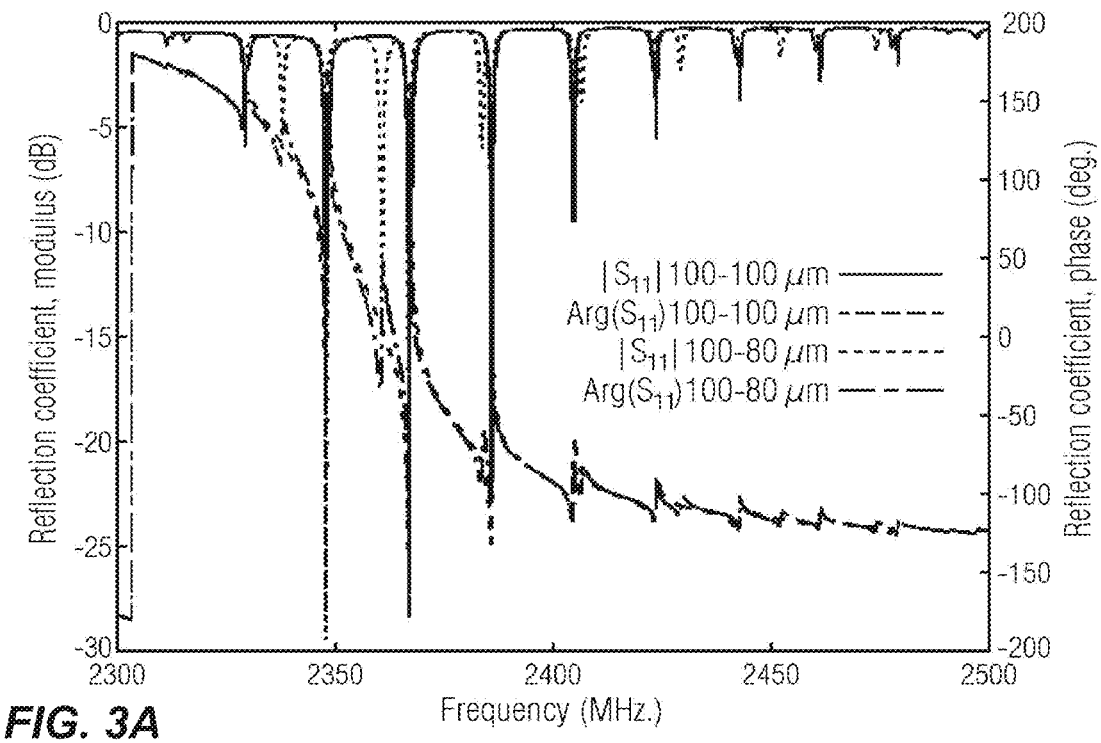
FIGS. 3A and 3B represent an illustration of the effect of the formation of a metallization layer on one of two resonance cavities of an acoustic wave sensor device according to an embodiment.
Figure 3B:
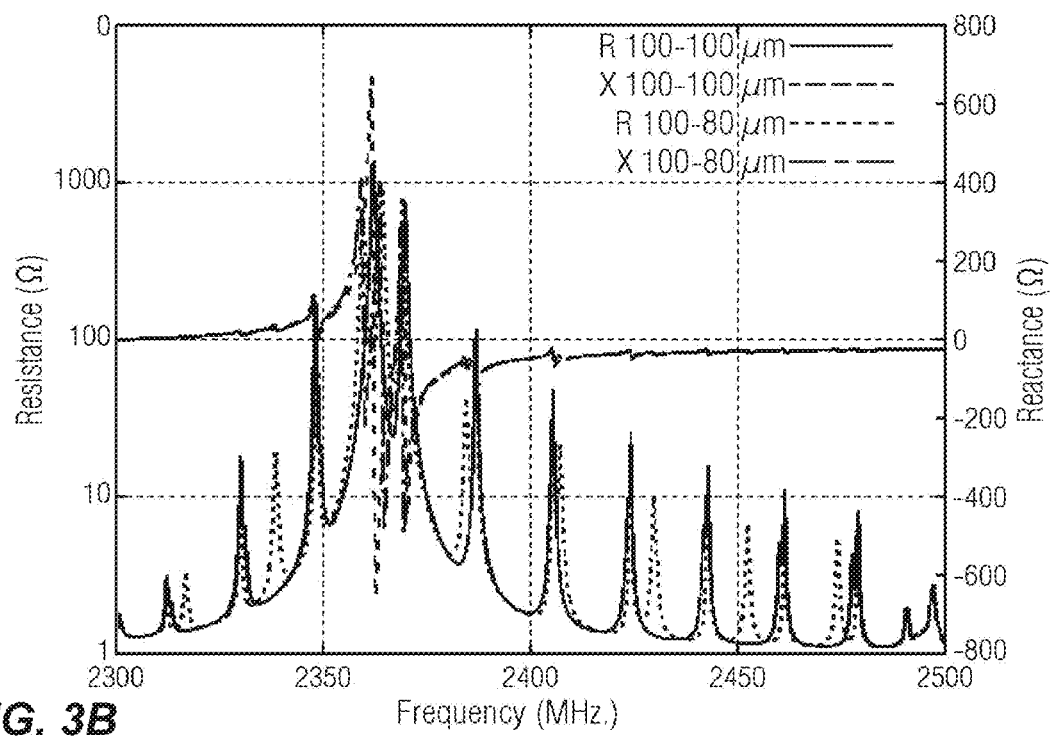

An effect of the provision of the physical and/or chemical modification p of one of the resonance cavities $R_1$ and $R_2$ is illustrated in FIGS. 3A and 3B. The physical and/or chemical modification p is realized by forming a metallization layer of 100 nm thickness on the region of the resonance cavity $R_2$; no metallization layer is formed on the resonance cavity $R_1$. In some detail, an AlCu metallization layer is formed on the region of the resonance cavity $R_2$, AlCu is also used for the formation of the comb transducer T and electrodes of the Bragg mirrors $M_1$ and $M_2$, and it is used an $LiTaO_3$ (XY)/42° layer of thickness of 600 nm on an $SiO_2$ layer of thickness of 500 nm on (100) Si, a comb transducer with 125 finger pairs, mirrors with 60 electrodes and an acoustic aperture of 70 μm, which translates to 42 wavelengths λ of the excited surface acoustic waves. The obtained reflection coefficient $S_{11}$ is illustrated on the left-hand side of FIGS. 3A and 3B and the obtained impedance is illustrated on the right-hand side of FIGS. 3A and 3B. Varying the thickness of the metallization layer or the length of one of the cavities allows for clearly identifying which modes belong to the metallized resonance cavity $R_2$ and modes belong to the non-metallized one $R_1$.

In particular, FIGS. 3A and 3B show what happens when, for instance, the $R_2$ cavity length is varied from 100 to 80 μm. One can see that only peaks related to resonances established in the $R_2$ cavity are affected by this change. Actually, when both cavities exhibit the same length, only the solid line signature is predicted as resonances of cavity $R_1$ and $R_2$ are superimposed and thus contribute to the reflection coefficient $S_{11}$ or the impedance $Z_{11}$ response of the resonator at identical frequencies (for instance, the most marked at 2.35, 2.37 and 2.39 GHz). Changing the length of one cavity translates to locally modifying the wave propagation properties and thus actually simulates the sensor operation principle. It turns out that when the cavity length is reduced, the above mentioned mode resonances split in two contributions (the dashed line) with preservation of the initial ones corresponding to $R_1$ cavity resonances and occurrence of a second set of resonances related to cavity $R_2$. The quasi-independence of the two resonance sets demonstrates the actual operation of the disclosure.

Figure 4A:
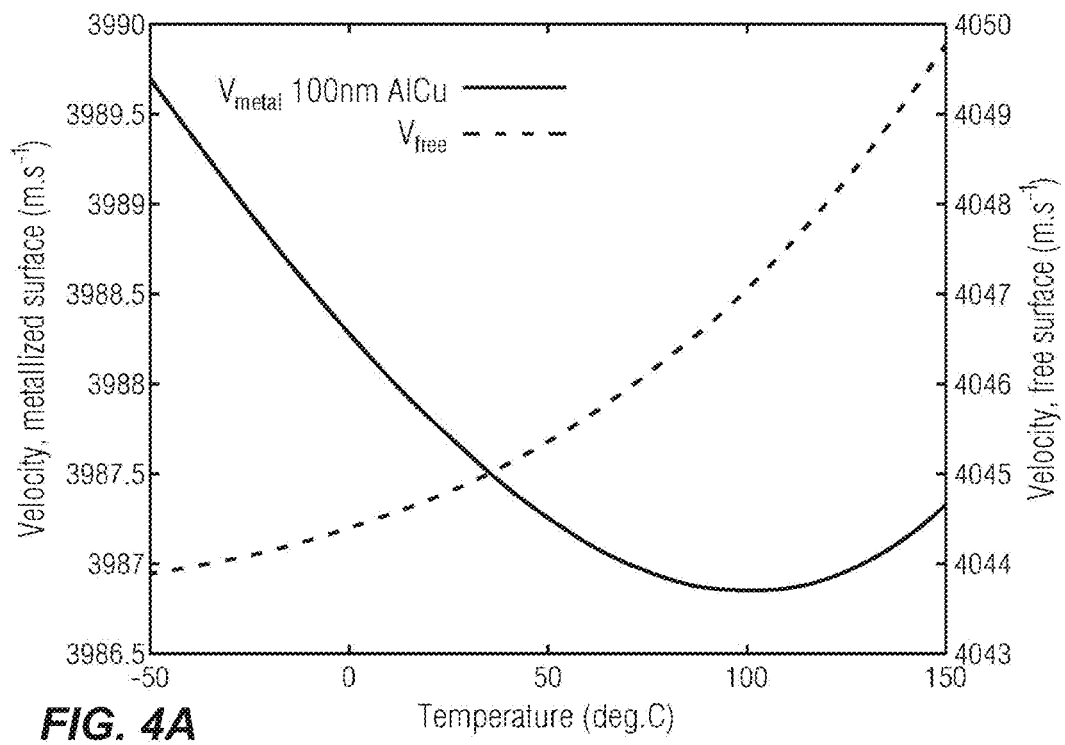
FIGS. 4A and 4B represent an illustration of differences in the temperature coefficients of velocity obtained by metallization of one of two resonance cavities of an acoustic wave sensor device according to an embodiment.
Figure 4B:
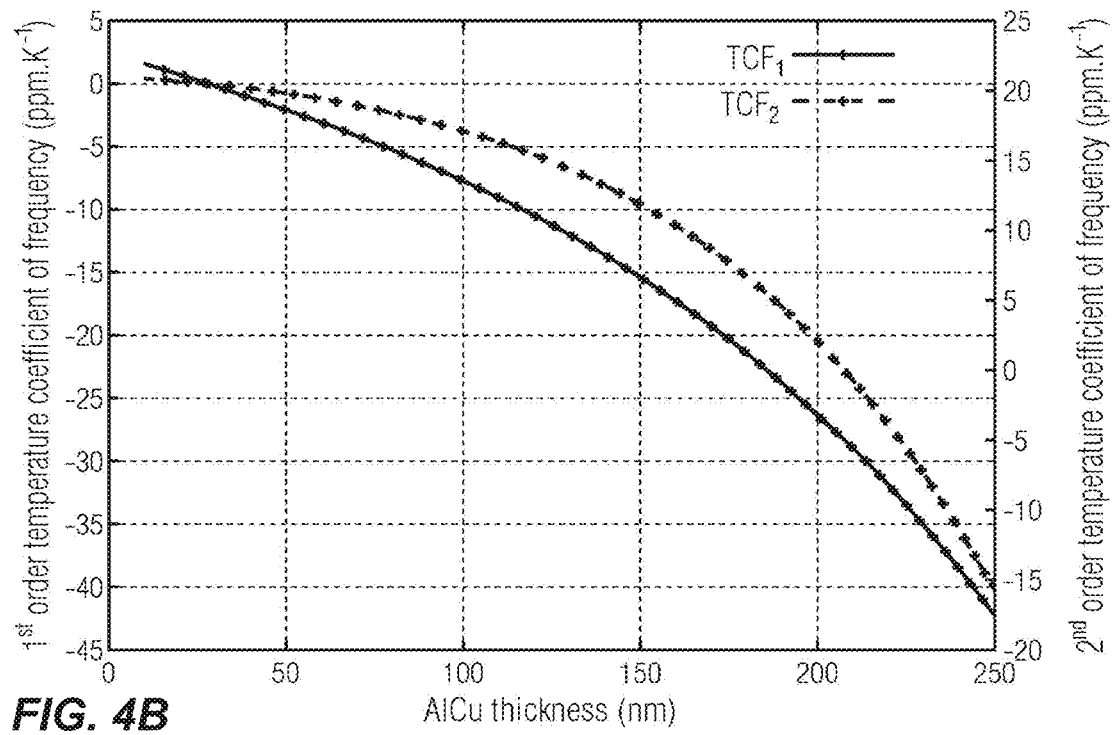

The associated temperature coefficients of velocity of the metallized and the free surfaces of the resonance cavities differ from each other as it is illustrated in FIGS. 4A and 4B. For an operation frequency of about 2.45 GHz a detectable difference of about 10 ppm per Kelvin can be obtained (see left-hand side of FIGS. 4A and 4B). The dependency of the difference of the temperature coefficients of velocity on the thickness of the metallization layer is illustrated on the right-hand side of FIGS. 4A and 4B.

When the same material is used for the metallization and the formation of the comb transducer T and electrodes of the Bragg mirrors $M_1$ and $M_2$, all of these elements can be deposited in the same deposition process. In other embodiments, a different material is used for the metallization. In other embodiments, one metallization layer or passivation layer of one material is formed on the first resonance cavity $R_1$ and another metallization layer or passivation layer of another material is formed on the second resonance cavity $R_2$. For example, a positive-temperature shifting material, for example, $SiO_2$ or $Ta_2O_5$, is formed on one of the resonance cavities and a negative-temperature shifting material, for example, $Si_3N_4$ or AlN, is formed on the other one of the resonance cavities.

Figure 5A:
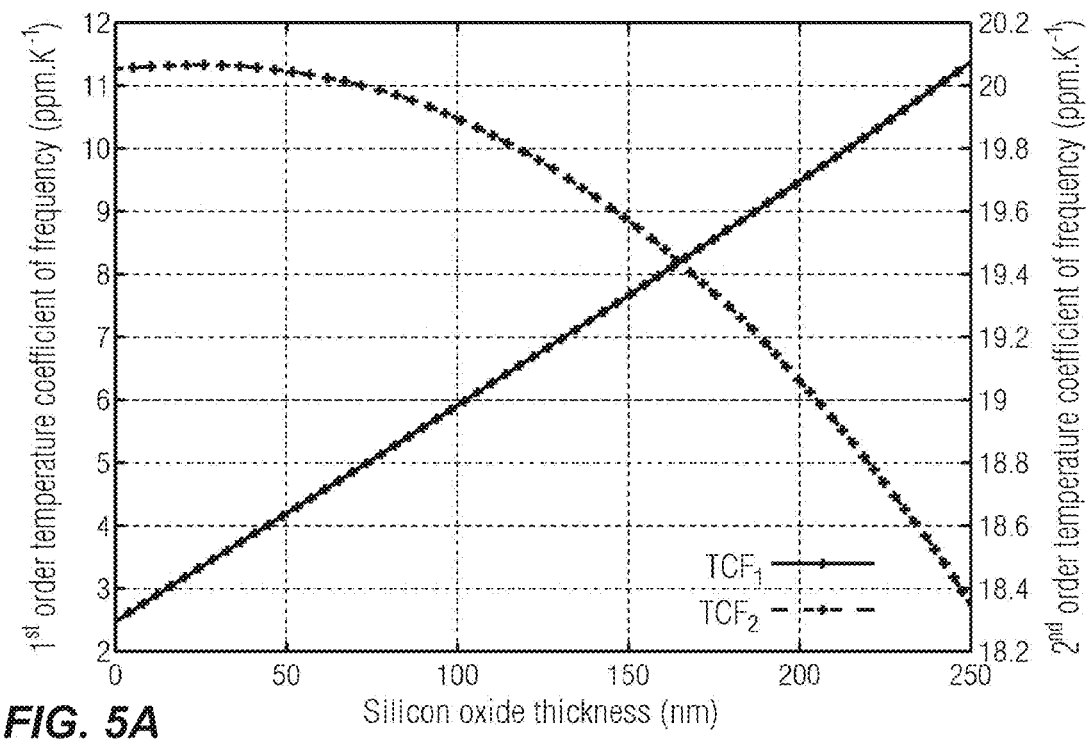
FIGS. 5A and 5B represent an illustration of differences in the temperature coefficients of velocity obtained by either metallization or recessing a piezoelectric layer of one of two resonance cavities of an acoustic wave sensor device according to an embodiment.
Figure 5B:
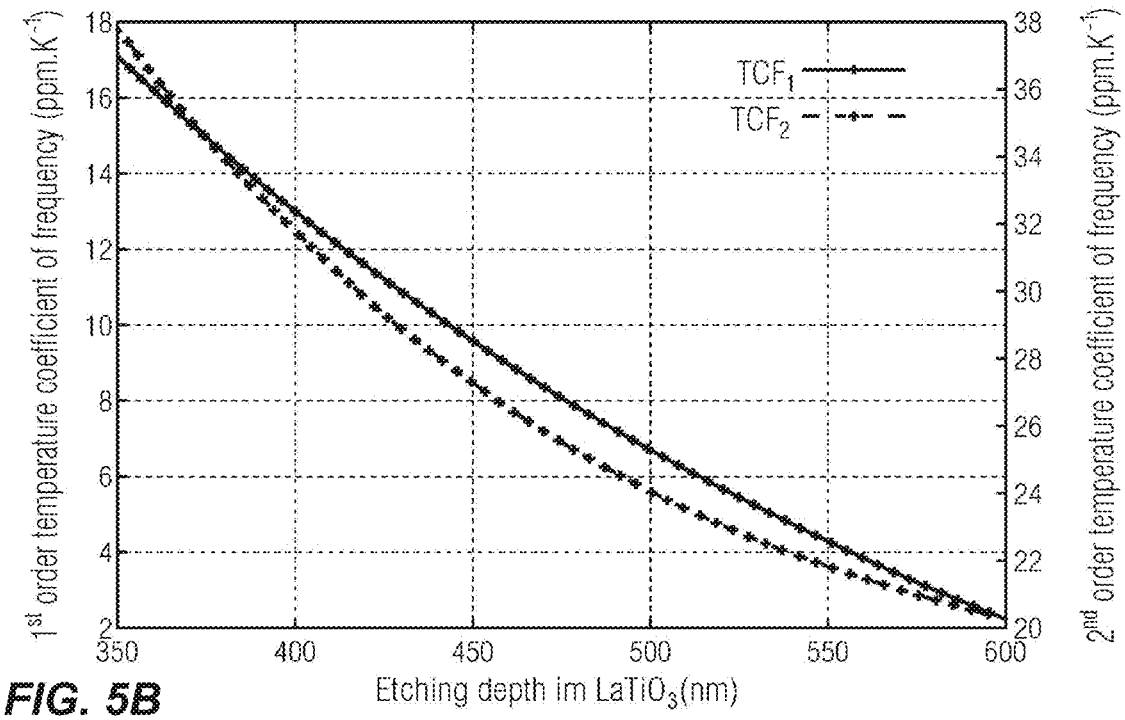

According to an alternative embodiment, realization of the physical and/or chemical modification p can be achieved by recessing a piezoelectric layer of one of the two resonance cavities. FIGS. 5A and 5B comparatively illustrate the effects of a passivation of one of the resonance cavities by an $SiO_2$ overlay up to a thickness of 250 nm (left-hand side) and recessing the piezoelectric layer of one of the resonance cavities from 600 nm down to 350 nm (right-hand side), respectively, on the temperature coefficient of velocity. Again, it is used (or started from) an $LiTaO_3$ (XY)/42° layer of thickness of 600 nm on an $SiO_2$ layer of thickness of 500 nm on (100) Si, a comb transducer with 125 finger pairs, mirrors with 60 electrodes and an acoustic aperture of 70

μm. In the case of passivation by an $SiO_2$ layer a detectable difference of the temperature coefficients of velocity of about 10 ppm per Kelvin can be obtained, whereas in the case of recessing the piezoelectric layer a detectable difference of the temperature coefficients of velocity of about 14 ppm per Kelvin can be obtained, both for an operation frequency of about 2450 MHz.

Figure 6:
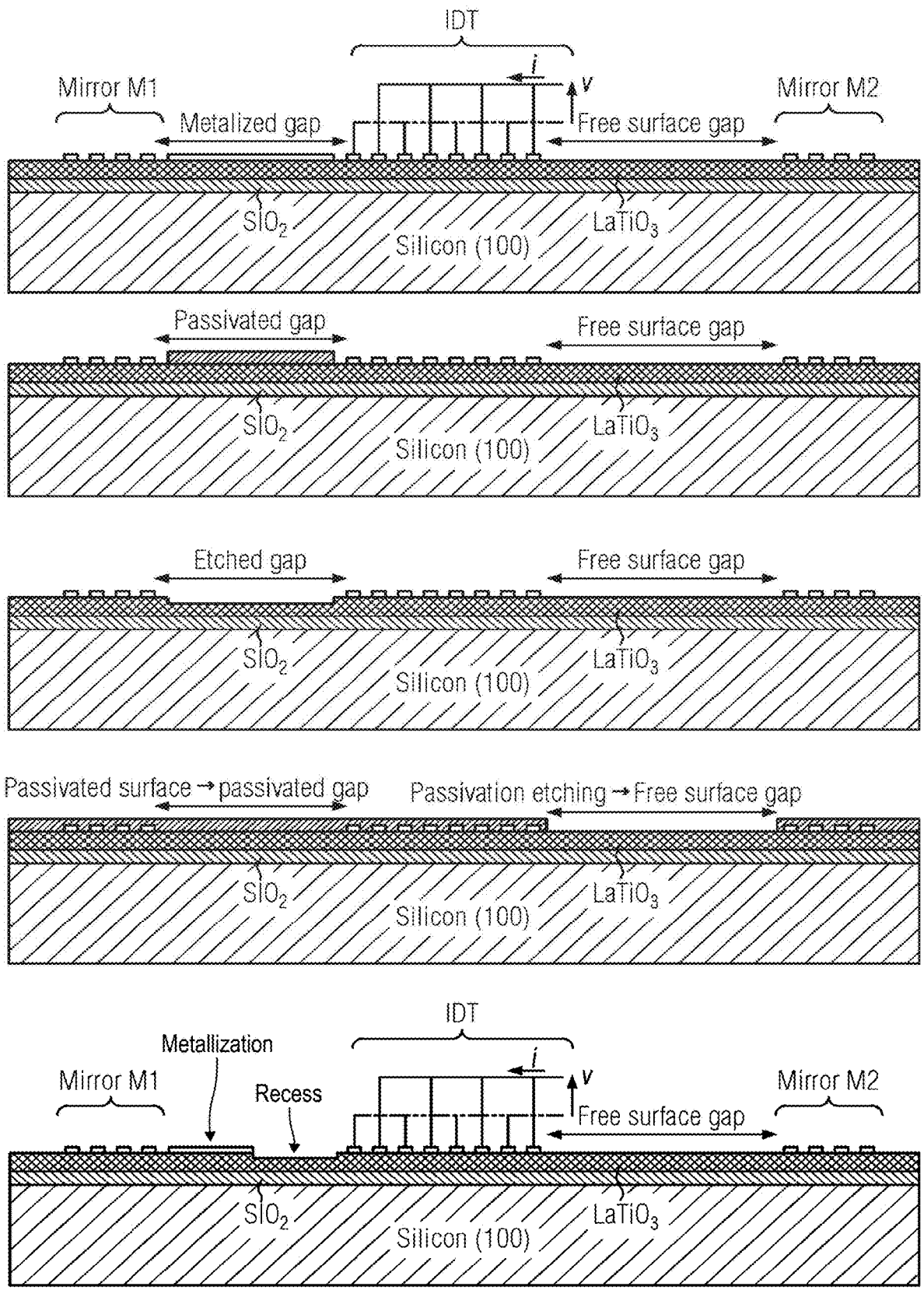
FIG. 6 represents illustrations of embodiments of an inventive acoustic wave sensor device.

Furthermore, according to different embodiments, different physical and/or chemical modifications p can be performed for the first resonance cavity $R_1$ and the second resonance cavity $R_2$. Additionally, the extension lengths of the resonance cavities $R_1$ and $R_2$ may differ from each other in order to more clearly separate the spectral responses of the resonances on each side of the comb transducer from each other. FIG. 6 illustrates a variety of exemplary embodiments in cross-sectional views. In all of the embodiments shown in FIG. 6 a (100) silicon bulk substrate is provided for the sensor device and a $SiO_2$ layer is formed on the (100) silicon bulk substrate and an $LiTaO_3$ layer is formed on the $SiO_2$ layer, for example. It goes without saying that other suitable materials may be used.

In the upper, first row of FIG. 6, an embodiment is illustrated in that the left-hand side resonance cavity is metallized whereas the right-hand side resonance cavity is not metallized but has a larger extension than the left-hand side one. In the second row from the top, an embodiment is illustrated in that the left-hand side resonance cavity is passivated whereas the right-hand side resonance cavity is not passivated but has a larger extension than the left-hand side one. Passivation may be realized by forming a passivation layer made of or comprising $Si_3N_4$, $Al_2O_3$ or AlN. In the third row from the top, an embodiment is illustrated in that the left-hand side resonance cavity is recessed (etched) whereas the right-hand side resonance cavity is not recessed or otherwise treated but has a larger extension than the left-hand side one. In the fourth row, an embodiment is illustrated in that the left-hand side resonance cavity is passivated whereas the right-hand side resonance cavity is not passivated but has a larger extension than the left-hand side one. Different from the embodiment shown in the second row from top of FIG. 6, a passivation layer is not only formed on the left-hand side resonance cavity but also on the comb transducer and the Bragg mirrors. For example, the passivation layer may be initially formed on the entire structure and, then, removed from the region of the right-hand side resonance cavity. In the bottom row, an embodiment is illustrated in that the left-hand side resonance cavity has a metallization layer in a part of cavity and another part of the cavity is etched. In all embodiments shown in FIG. 6, the left-hand side and right-hand side resonance cavities exhibit different sensitivities to measurands due to the provided different resonance characteristics and, thus, allow for differential measurements.

According to other embodiments, material layers can be formed on both resonance cavities. Moreover, material layers formed on one or more of the resonance cavities may have inhomogeneous thicknesses along the direction of propagation of the acoustic waves. Further, multi-layers may be formed on one or more of the resonance cavities. In this context, it should be noted that, in general, provision of a material layer on a resonance cavity may result in a reduction of the phase velocity of acoustic waves due to mass loading effects, particularly, if layers of a material of a high atomic number, as Pt, Au or W, are used. This effect can be compensated by adding a layer exhibiting a relatively high acoustic velocity, for example, AlN, $Si_3N_4$, $Al_2O_3$.

Figure 7:
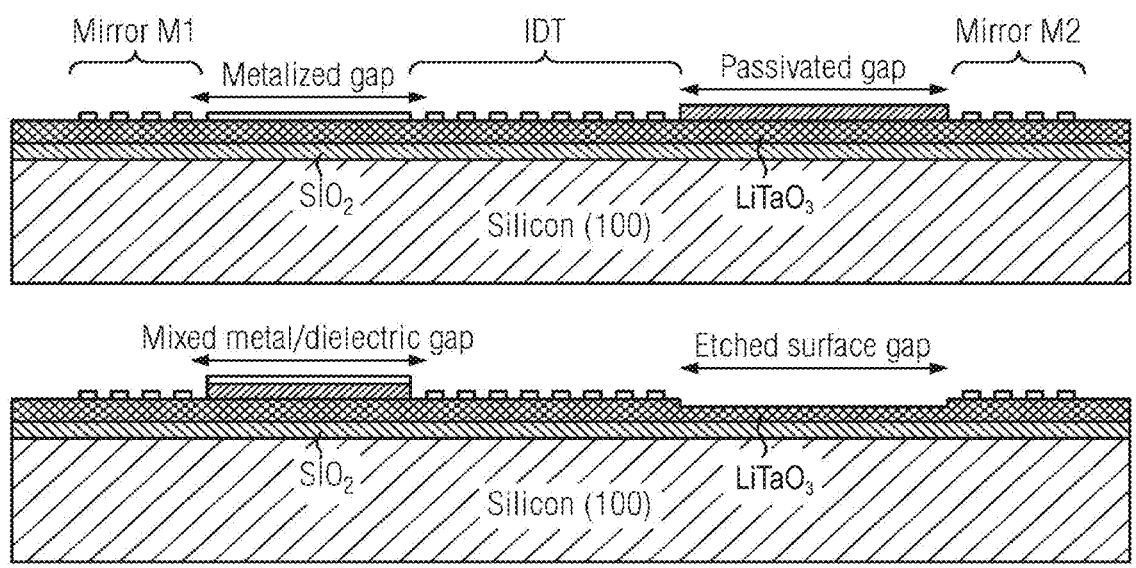
FIG. 7 represents illustrations of further embodiments of an inventive acoustic wave sensor device.

FIG. 7 illustrates an embodiment wherein a left-hand side resonance cavity is metallized and a right-hand side resonance cavity is passivated (upper row of FIG. 7) and an embodiment wherein a left-hand side resonance cavity is covered by a multi-layer, for example, a metal layer formed on a dielectric layer, and a right-hand side resonance cavity is recessed (lower row of FIG. 7).

It should also be noted that the passivation, the recessed structure or the metallization or any combination of such surface modifications may comprise or consist of some grating, in particular, periodic gratings operating out of the Bragg condition of the wave emitted by the IDT (i.e., non-reflective gratings). Moreover, the surface modification may be partially applied to the cavity concerned.

In all of the above-described embodiments, Bragg mirrors are provided in order to form the resonance cavities. However, according to alternative embodiments, the Bragg mirrors may be replaced by side/edge reflection structures for pure shear modes guidance. Thereby, very compact configurations can be achieved in that the Bragg reflection is replaced by a flat surface reflection without any energy loss or mode conversion. Configurations with side/edge reflection structures for pure shear modes guidance are particularly useful for sensing ambient parameters in liquids. Shear waves are very suitable for in-liquid probing. Particularly, highly coupled modes (>5%) together with high-k materials (with a dielectric constant k larger than 30, for example) are attractive for in-liquid applications.

Figure 8:
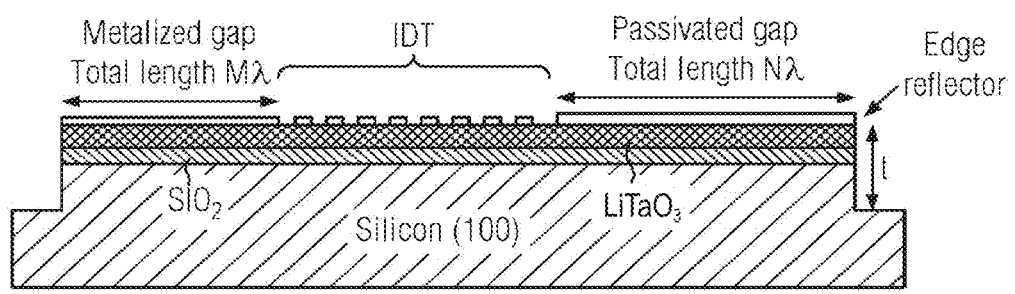
FIG. 8 represents an illustration of an embodiment of an inventive acoustic wave sensor device comprising side reflection structures.

An exemplary embodiment making use of side reflection structures rather than Bragg mirrors is shown in FIG. 8. An IDT is formed on a stack comprising an $SiO_2$ layer that is formed on a (100) silicon bulk substrate and an $LiTaO_3$ layer that is formed on the $SiO_2$ layer. Resonance cavities of different extensions are provided left and right of the IDT. The extensions may be multiple integers of the wavelength λ of the excited acoustic waves. The left-hand side resonance cavity is metallized and the right-hand side resonance cavity is passivated. The sensor device comprises side/edge reflection structures, i.e., recesses with depth t at the edges extending into the Si bulk substrate, for generating resonances. The depth of the recesses t (or thickness of the edges) has to be larger than one wavelength λ of the excited acoustic waves, particularly, larger than 5λ.

Figure 9:
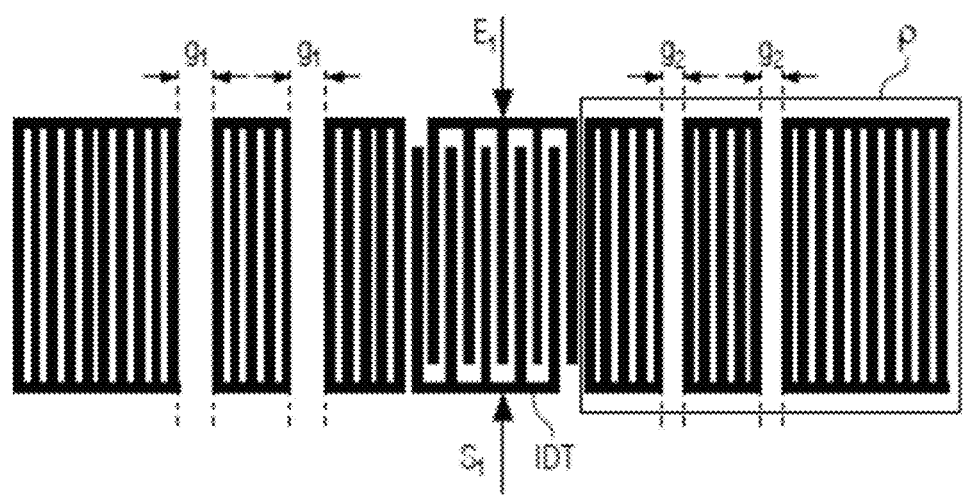
FIG. 9 represents an illustration of an embodiment of an inventive acoustic wave sensor device comprising cascaded resonance cavities.

In all of the above-described embodiments comprising Bragg mirrors, simple resonance cavities are employed. However, all of these embodiments may employ cascaded resonance cavities comprising multiple mirror electrode structures. An exemplary embodiment comprising cascaded resonance cavities is shown in FIG. 9. In this embodiment, three-mirror electrode structures separated by gaps $g_1$ and $g_2$ resulting in resonance sub-cavities are provided on each side of the IDT. Different widths of the cavities $g_1$ and $g_2$ may result in a limitation of the number of 50Ω matched resonances to only two, which is different to more than two resonances that arise in the previously described embodiments. The distance between the two resonances as well as the coupling coefficient of the resonances can be controlled by the number of the mirror electrode structures and resonance sub-cavities.

In the case of using cascaded resonator cavities, it is possible to use a transducer, which does not operate at the Bragg condition. For instance, the transducer may exhibit three or four fingers per wavelength or even 5 fingers per two wavelengths and in general all suitable structures allowing to excite waves at a given synchronism without wave reflection on the IDT electrodes.

Figure 10:
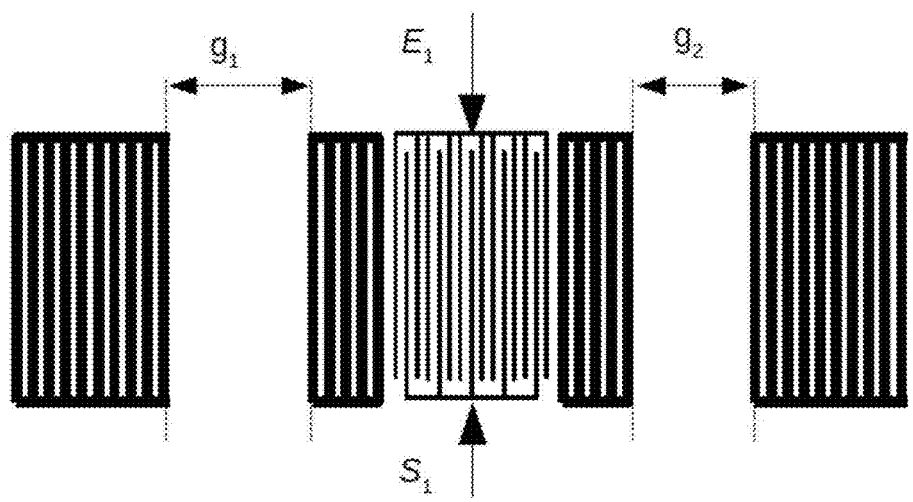
FIG. 10 represents an illustration of a cascaded resonance cavity configuration of an acoustic wave sensor device wherein the transducer does not operate at the Bragg condition according to an embodiment of the present invention.
Figure 11:
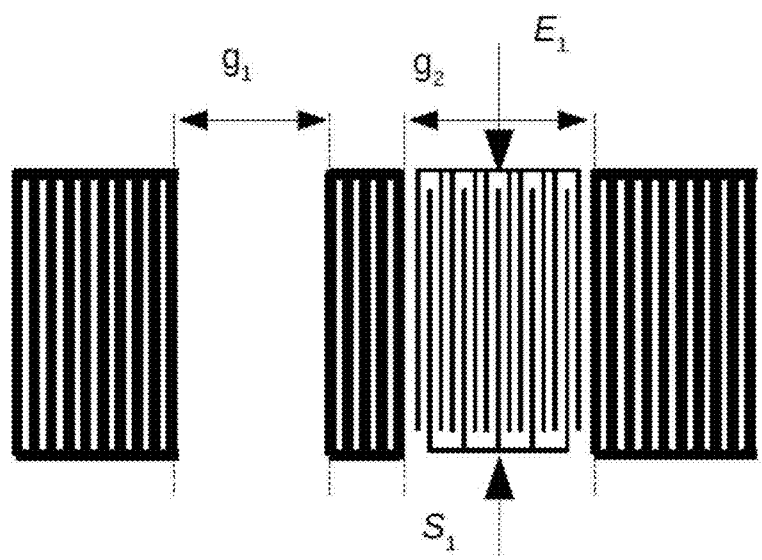
FIG. 11 represents an illustration of another cascaded resonance cavity configuration of an acoustic wave sensor device wherein the transducer does not operate at the Bragg condition.

Two examples for possible configurations in this respect are shown in FIGS. 10 and 11. According to one configuration (see FIG. 10) smaller mirrors are arranged close to the transducer and larger mirrors separated by distances $g_1$ and $g_2$, respectively, from the smaller mirrors are additionally provided to guarantee resonances in the resonance cavities. FIG. 11 illustrates a configuration in that on the-left-hand side no Bragg condition is fulfilled for the operation of the transducer. One or more of the resonance cavities may be physically and/or chemically modified as it is described above. It is worth noting that in the examples shown in FIGS. 10 and 11, some supplementary resonances are established in the IDT region itself, i.e., the IDT operates as a supplementary cavity, which could potentially be used to complete the measurements.

According to further embodiments, the acoustic wave sensor can be used for chemical detection. In this case, on one of the resonance cavities a material layer is formed that exhibits a particular chemical activity with respect to some chemical species that is to be detected whereas the other one of the resonance cavities maintains free of such a material layer or is covered by a material layer without that particular chemical activity. With the exception of sensitivity to the chemical species both resonance cavities should exhibit the same sensitivity to ambient parameters as, for example, the temperature or water loading properties. The chemical activity may result in some specific deposition of material of the chemical species and, thus, mass or elastic loading effects that in course change the resonance frequency of the resonance cavity. An example is hydrogen absorption by a layer made of or comprising palladium.

Furthermore, it is noted that it is also envisaged herein an operation situation in that the reflection coefficient of the transducer T is not strong enough to allow for a clear enough separation between the resonances of the cavities. In that case, (for example, in all of the above-described embodiments) the IDT may be split into two parts with an additional reflector provided in the middle of two parts in order to improve the cavity resonance separation. This will be particularly useful for Rayleigh or more generally elliptically polarized waves on quartz, langasite, lithium tantalate single-crystal substrates and composite substrates including GaN, AlN and ZnO layers because the corresponding modes are generally exhibiting a coupling factor smaller than 1% and a reflection coefficient on a unique electrode of less than 5%, typically less than 3% and even less or equal 1%. To some extent, the reflection coefficient is related to the coupling factor as it is generally composed of a mechanical part (elastic and mass loading effect) and an electric part (electrical load effect).

For POI configurations using $LiTaO_3$ layers with an electromechanical coupling in excess of 5%, it can be demonstrated by computation that the reflection coefficient is larger than 5% and may reach 10% or even more (15% measured, >20% computed considering metal of high atomic number). For quartz, it can be shown that adding a central mirror inside the transducer allows for obtaining the separation of the two cavity modes. This consideration is particularly true for AlCu based electrodes. The use of electrode with high atomic number like, for instance, molybdenum or gold or platinum or tungsten may allow for large reflection coefficients (particularly for single crystals, not for AlN or GaN based layered substrates). It is also of interest in such a configuration to use single phase unidirectional transducers (SPUDT) in order to promote the emission of the waves in a given direction, again, in order to facilitate the separation between the resonances of the cavities.

For example, for Rayleigh waves on lithium niobate, particularly, on the $LiNbO_3$ (YX1)/128° cut the coupling factor is larger than 5% but the electrical and mechanical parts of the reflection coefficient are exhibiting an opposite sign in short-circuit mode (the mode used for exciting and detecting the elastic waves), thus yielding moderate reflection coefficient for usual metallization (relative metallization h/k between 1 and 5%), particularly, for devices operating close to 2.45 GHz. Furthermore, using such a combination of material and mode yields relatively short transducers meeting the 50Ω condition.

For instance, a transducer with 15 electrode pairs does exhibit the said condition at its synchronism frequency. With a limited reflection coefficient per electrode (i.e., <5% or even 3% or even less), such a length may not be sufficient to provide a global reflection coefficient larger than 50% and preferentially larger than 80%. As a consequence, one might split here also the transducer in two parts and insert a reflecting grating in between the said two parts in order to increase the cavity separation. In particular, it is of interest to use a mirror grating operating at the open circuit mode, meaning that each electrode is electrically isolated, thus meeting the condition of global neutral charge. According to this condition, the sign of the mechanical and electrical parts of the reflection coefficient is similar and the resulting reflection effect is twice or three-times larger than for the short-circuit condition. As in the case of other single crystals, the use of SPUDT effects can be useful to improve the device operation. The SPUDT effect will be obtained by introducing a gap between the transducer and the open circuit mirror grating reflector. These considerations are particularly true for AlCu electrodes.

Figure 12:
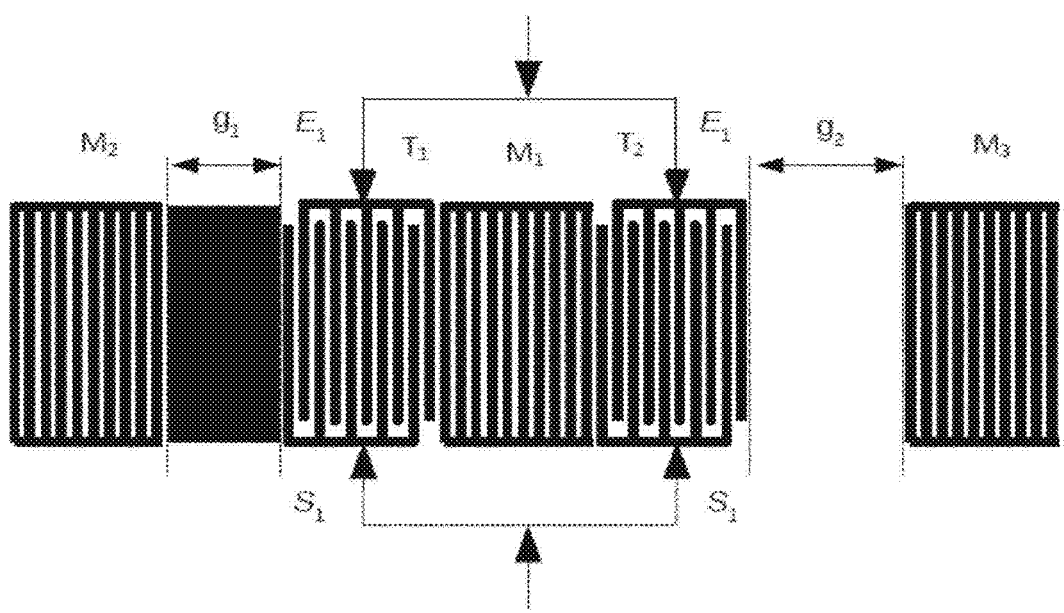
FIG. 12 represents a principle sketch illustrating a surface acoustic wave sensor device comprising two transducers and a central mirror located between the two transducers according to an embodiment of the present disclosure.

A configuration of a surface wave acoustic sensor device with a transducer split into two parts or two transducers with a reflection structure positioned between the two parts or two transducers is illustrated in FIG. 12.

The surface acoustic wave sensor device shown in FIG. 12 comprises a first transducer T1 and a second transducer T2 or a first part T1 and a second part T2 of a transducer. The transducers T1 and T2 may be interdigitated (comb) transducers connected to an antenna for receiving an electromagnetic wave and converting the electromagnetic wave into a surface acoustic wave. In fact, the first and second transducers T1 and T2 operate in parallel (thereby functioning as one single transducer) and receive an electromagnetic wave E1 and convert the received electromagnetic wave E1 into a surface acoustic wave S1, which after reflection by the mirrors is sensed again by the transducers T and T2.

In the shown example, the first transducer T1 and the second transducer T2 share one Bragg mirror structure M1 that is positioned between them. The surface acoustic wave sensor device comprises a second Bragg mirror structure M2 that is separated from the first transducer T1 by a resonance cavity of the length g1. Further, the surface acoustic wave sensor device comprises a third Bragg mirror structure M3 that is separated from the second transducer T2 by a resonance cavity of the length g2>g1 (it should be noted that, in principle, the two resonance cavities may have the same lengths or g1<$g_2$ may hold).

Particularly, the SAW pressure sensor device illustrated in FIG. 12 may comprise a multi-layer substrate comprising a bulk substrate, for example, an Si substrate, formed as a membrane that bends under the application of an ambient pressure, a dielectric layer, for example, an $SiO_2$ layer, formed on the bulk substrate and a piezoelectric layer, for example, an LiNbCh or LiTaCh layer, formed on the dielectric layer. Further, the bulk substrate may be a quartz substrate. In particular, the quartz substrate may have a cutting plane (X", Z") defined with respect to the cutting plane (X, Z) and in a reference system (X", Y", Z"), where X, Y, Z are crystallographic axes of quartz, a direction of propagation of the waves being defined along an axis X''', a first cutting plane (C', Z') being defined by rotation by an angle f about the axis Z of the plane (X, Z) so as to define a first reference system (X, Y, Z') with an axis Z' that is the same as the axis Z, a second cutting plane (X", Z") being defined by rotation by an angle Q about the axis X' of the plane (C', Z') so as to define a second reference system (X", Y", Z") with the axis X" being the same as the axis X', the direction of propagation along the axis X''' being defined by rotation by an angle y of the axis X", in the plane (X", Z") about the axis Y", wherein: f is in the range of 600 to 0°, Q is in the range of −40° (cos(3cp))±40° and y is in the range of 35°+10° (sin(3cp))±22.5°.

The bulk substrate may be supported by posts. The bulk substrate and the posts may be formed integrally, for example, by providing an initial bulk substrate and forming a recess in the initial bulk substrate in order to form the bulk substrate (membrane). The SAW pressure sensor device shown in FIG. 12 may, furthermore, comprise a supporting substrate, lid and/or seals as known in the art. An additional SAW sensor device may be provided outside of the bending bulk substrate (portion), for example, above the posts in order to measure an ambient temperature.

According to the embodiment illustrated in FIG. 12, the upper surface of the resonance cavity with length g1 comprises a physical and/or chemical modification as compared to the upper surface of the resonance cavity with length g2. Alternatively, the upper surface of the resonance cavity with length g2 could comprise a physical and/or chemical modification as compared to the upper surface of the resonance cavity with length g1. However, no surface modification may be present in other alternative embodiments.

Due to the modification of the upper surface of the resonance cavity with length g1 the propagation characteristics of acoustic waves generated by the interdigitated transducer T1 differs from the ones in the resonance cavity with length g2. Thereby, a very reliable and sensitive differential sensor apparatus for sensing pressure can be provided.

For the sake of electrical response optimization, the transducer T1 and T2 may exhibit different lengths (perpendicular to the traveling direction of the surface waves) and/or apertures as the two resonance cavities with different surface conditions exhibit different physical properties that may yield to unbalanced contributions of the corresponding modes to the sensor electrical responses. For example, a metalized resonance cavity may exhibit more losses (due to the metal properties itself or the degradation of surface roughness, for instance) than a resonance cavity with a free surface. Therefore, it may be useful to increase the length of one of the two transducers to compensate for enhanced losses in the corresponding cavity and therefore provide balanced contributions of the resonance modes. However, this approach may also substantially modify the overall electrical response of the sensor, actually loading the transducer, which does not suffer from the additional leakage caused by the physical and/or chemical modification with some static capacitance of the modified transducer. In this context, one might reduce the aperture of the modified transducer to benefit from the extended length yielding an enhanced signal strength and narrower transducer bandwidth and control its static capacitance to preserve the electrical sensor response. In that situation, the central mirror may actually exhibit the acoustic aperture of the largest of the two transducers to guarantee an optimal acoustic operation on both sides of the sensor device.

Without modification the first and second upper surfaces are free (exposed) surfaces, particularly, free surfaces of a piezoelectric layer of the combined acoustic wave pressure and temperature sensor device. The physical and/or chemical modification may be realized by forming a material layer (for example, a metallization layer or a passivation/dielectric layer) on the surface of the resonance cavity with length g1 only or a material layer on the surface of the resonance cavity with length g1 and another material layer (which is made of a different material as compared to the material layer formed on the second upper surface) on the surface of the resonance cavity with length g2.

Alternatively or additionally, the physical and/or chemical modification may comprise a recess of the surface of the resonance cavity with length g1 with respect to the surface of the resonance cavity with length g2. According to further embodiments the resonance cavity with length g1 comprises another physical and/or chemical modification that is different from the one of the resonance cavity with length g2. All combinations of the named modifications are envisaged as long as the modifications of the surfaces of the cavities differ from each other in order to guarantee different resonance characteristics of the resonance cavities. It has to be understood that the thus described surface modification of a resonance cavity can be provided for any of the embodiments disclosed herein.

It is, furthermore, noted that in the configuration shown in FIG. 12 may comprise tapered transducers with lateral extensions of the electrodes varying along the lengths of the transducers.

A single acoustic wave sensor device of the above-described embodiments may be supplemented by one or more additional acoustic wave sensor devices. For example, thereby combined acoustic wave pressure and temperature sensor devices can be realized as it is exemplary illustrated in FIGS. 13 and 14. The combined acoustic wave pressure and temperature sensor device 100 shown in FIG. 13 comprises a first transducer T101 of a first sensor de vice and a second transducer T102 of a second sensor device. In principle, the second transducer T102 may be part of both the first and the second sensor device. The transducers T101 and T102 may be interdigitated (comb) transducers connected to an antenna for receiving an electromagnetic wave and converting the electromagnetic wave into a surface acoustic wave.

The second sensor device comprising the second transducer T102 is configured for sensing an ambient temperature. The first sensor device comprising the first transducer T101 is configured for sensing a pressure in accordance with the above-described embodiments. Additionally, the first sensor device may be also configured for sensing the ambient temperature. In this case, with respect to the sensing of the ambient temperature the first and second sensor devices constitute a differential acoustic wave temperature sensor device.

The first sensor device comprises a first Bragg mirror structure M 101 that is separated from the first transducer T101 by a first resonance cavity of the length g1. Furthermore, the first sensor device comprises a second Bragg mirror structure M102 that is separated from the first transducer T101 by a second resonance cavity of the length g2. The first sensor device may comprise a single transducer. Alternatively, it may comprise the configuration with two transducers and a central additional Bragg mirror located between the two transducers as described with reference to FIG. 12. The second sensor device comprises a third Bragg mirror structure M103 that is separated from the second transducer T102 by a third resonance cavity of the length g3 that may or may not differ from the lengths g1 and/or g2 of the first and second cavities, respectively. Another cavity with a length g4 is formed between the second Bragg mirror structure M102 and the second transducer T102.

Figure 13:
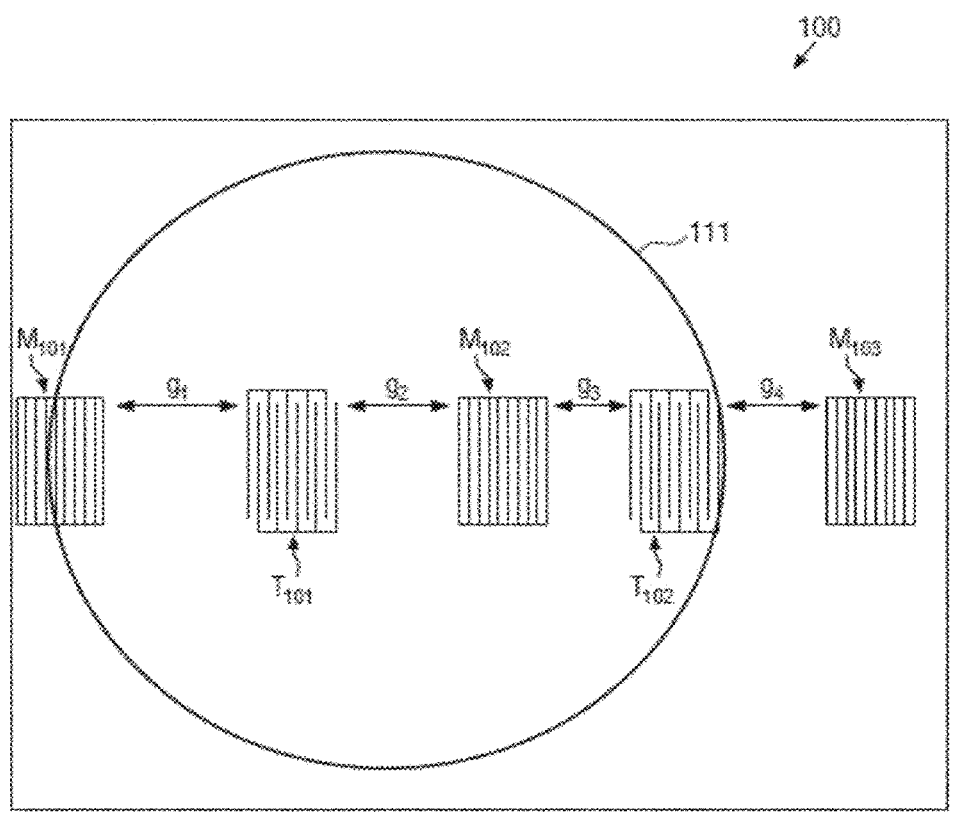
FIG. 13 represents a principle sketch illustrating a combined acoustic wave pressure and temperature sensor device according to an embodiment of the present disclosure.

Particularly, the sensor devices illustrated in FIG. 13 may comprise a multi-layer substrate comprising a bulk substrate 11, for example, an Si substrate, formed as a membrane that bends under the application of an ambient pressure, a dielectric layer, for example, an $SiO_2$ layer, formed on the bulk substrate and a piezoelectric layer, for example, an LiNbCh or LiTaCh layer, formed on the dielectric layer. The bulk substrate 111 may be supported by posts. The bulk substrate and the posts may be formed integrally, for example, by providing an initial bulk substrate and forming a recess in the initial bulk substrate in order to form the bulk substrate (membrane). The cavity with the length g3 as well as the third Bragg mirror structure M103 of the second sensor device are not formed on the substrate that is subject to the above-described bending when some external pressure is applied. The sensor device shown in FIG. 8 may, furthermore, comprise a supporting substrate, lid and/or seals as known in the art.

In particular, the upper surface of the first resonance cavity with length g1 and/or the upper surface of the resonance cavity with length g2 may or may not comprise some surface modification as it was described above.

Without modification the first and second upper surfaces are free (exposed) surfaces, particularly, free surfaces of a piezoelectric layer of the combined acoustic wave pressure and temperature sensor device. The physical and/or chemical modifications may be realized by forming a material layer (for example, a metallization layer or a passivation/dielectric layer) or by controlled doping, without exclusion of other means.

Figure 14:
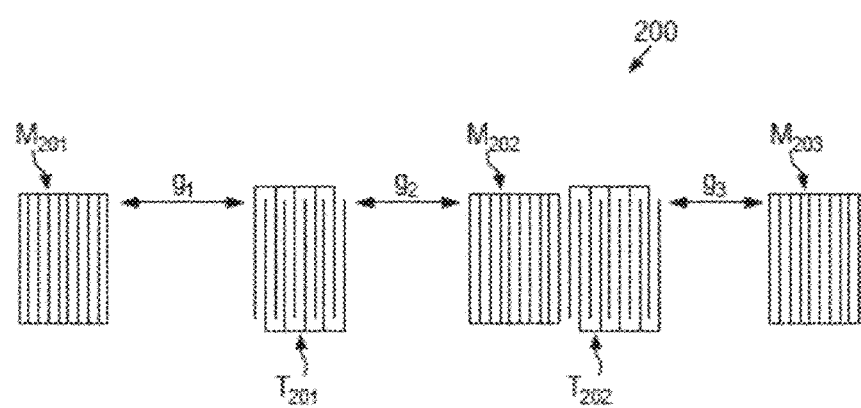
FIG. 14 represents a principle sketch illustrating a combined acoustic wave pressure and temperature sensor device according to another embodiment of the present disclosure.

FIG. 14 shows an alternative configuration to the one illustrated in FIG. 13. As compared to the configuration illustrated in FIG. 13 according to the embodiment shown in FIG. 14 the combined acoustic wave pressure and temperature sensor device 200 comprises only three rather than four cavities.

The combined sensor device 200 shown in FIG. 14 comprises a first transducer T201 of a first sensor device and a second transducer T202 of a second sensor device. The second sensor device comprising the second transducer T202 is configured for sensing an ambient temperature. The transducers T201 and T202 may be interdigitated (comb) transducers connected to an antenna for receiving an electromagnetic wave and converting the electromagnetic wave into a surface acoustic wave. The first sensor device comprising the first transducer T201 is configured for sensing a pressure in accordance with the above-described embodiments. Additionally, the first sensor device may be also configured for sensing the ambient temperature. In this case, with respect to the sensing of the ambient temperature the first and second sensor de vices constitute a differential acoustic wave temperature sensor device.

The first sensor device comprises a first Bragg mirror structure M201 that is separated from the first transducer T201 by a first resonance cavity of the length g1. Furthermore, the first sensor device comprises a second Bragg mirror structure M202 that is separated from the first transducer T201 by a second resonance cavity of the length g2. The first sensor device of the combined acoustic wave pressure and temperature sensor device 200 may comprise a single transducer. Alternatively, it may comprise the configuration with two transducers and a central additional Bragg mirror located between the two transducers as described with reference to FIG. 12. The second sensor device comprises a third Bragg mirror structure M203 that is separated from the second transducer T202 by a third resonance cavity of the length g3 that may or may not differ from the lengths g1 and/or g2 of the first and second cavities, respectively. Contrary, to the configuration illustrated in FIG. 13 according to the embodiment shown in FIG. 14 the combined sensor device 200 comprises no resonance cavity between the second Bragg mirror structure M202 and the second transducer T202.

Particularly, the sensor devices illustrated in FIG. 14 may comprise a multi-dlayer substrate comprising a bulk substrate, for example, an Si substrate, formed as a membrane that bends under the application of an ambient pressure, a dielectric layer, for example, an $SiO_2$ layer, formed on the bulk substrate and a piezoelectric layer, for example, an LiNbCh or LiTaCh layer, formed on the dielectric layer. The bulk substrate may be supported by posts. The bulk substrate and the posts may be formed integrally, for example, by providing an initial bulk substrate and forming a recess in the initial bulk substrate in order to form the bulk substrate (membrane). The cavity with the length g3 as well as the third Bragg mirror structure M203 of the second sensor device are not formed on the substrate that is subject to the above-described bending. The sensor device shown in FIG. 14 may, furthermore, comprise a supporting substrate, lid and/or seals as known in the art.

In particular, the upper surface of the first resonance cavity with length g1 and/or the upper surface of the resonance cavity with length g2 may or may not comprise some surface modification as it was described above.

Without modification the first and second upper surfaces are free (exposed) surfaces, particularly, free surfaces of a piezoelectric layer of the combined acoustic wave pressure and temperature sensor device. The physical and/or chemical modification may be realized by forming a material layer (for example, a metallization layer or a passivation/dielectric layer) or by controlled doping or by any way yielding substantial modification of the physical properties of the layer yielding a specific sensitivity to the regarded parameter.

All previously discussed embodiments are not intended as limitations but serve as examples illustrating features and advantages of the disclosure. It is to be understood that some or all of the above described features can also be combined in different ways.

The invention claimed is:

1. Acoustic wave sensor device, comprising:
   an interdigitated transducer;
   a first reflection structure arranged on one side of the interdigitated transducer;
   a second reflection structure arranged on another side of the interdigitated transducer;
   a first resonance cavity comprising a first upper surface and formed between the interdigitated transducer and the first reflection structure;
   a second resonance cavity comprising a second upper surface and formed between the interdigitated transducer and the second reflection structure;
   wherein the second upper surface comprises a physical and/or chemical modification as compared to the first upper surface; and wherein the physical and/or chemical modification comprises a recess of the second upper surface.

2. The acoustic wave sensor device of claim 1, wherein the physical and/or chemical modification comprises a metallization layer formed on the second upper surface.

3. The acoustic wave sensor device of claim 2, wherein the metallization layer comprises or consists of at least one of AlCu and Ti.

4. The acoustic wave sensor device of claim 2, wherein the first upper surface is modified by formation of a passivation layer on the first upper surface and/or formation of a recess of the first upper surface.

5. The acoustic wave sensor device of claim 1, wherein the physical and/or chemical modification comprises a passivation layer formed on the second upper surface, wherein the passivation layer comprises or consists of at least one of $Si_3N_4$, $Al_2O_3$, AlN, $Ta_2O_5$ and $SiO_2$.

6. The acoustic wave sensor device of claim 5, wherein the first upper surface is modified by formation of a metallization layer on the first upper surface and/or formation of a recess of the first upper surface.

7. The acoustic wave sensor device of claim 1, wherein the first upper surface is modified by formation of a metallization layer or passivation layer on the first upper surface.

8. The acoustic wave sensor device of claim 1, wherein the first reflection structure comprises or consists of a Bragg mirror and the second reflection structure comprises or consists of another Bragg mirror.

9. The acoustic wave sensor device of claim 1, wherein the first reflection structure comprises or consists of an edge reflection structure.

10. The acoustic wave sensor device of claim 1, wherein the first resonance cavity comprises first resonance sub-cavities separated from each other by first reflection sub-structures of the first reflection structure, and the second resonance cavity comprises second resonance sub-cavities separated from each other by second reflection sub-structures of the second reflection structure.

11. The acoustic wave sensor device of claim 1, further comprising:
 a bulk substrate;
 a dielectric layer formed on the bulk substrate; and
 a piezoelectric layer; and
 wherein the interdigitated transducer and the first and second reflection structures are formed on the piezoelectric layer and the first and second resonance cavities comprise the piezoelectric layer.

12. The acoustic wave sensor device of claim 11, wherein the bulk substrate comprises a silicon bulk substrate.

13. The acoustic wave sensor device of claim 11, wherein the dielectric layer comprises an $SiO_2$ layer.

14. The acoustic wave sensor device of claim 11, wherein the piezoelectric layer comprises a $LiNbO_3$ or $LiTaO_3$ layer.

15. The acoustic wave sensor device of claim 1, wherein extension lengths of the first resonance cavity and the second resonance cavity differ from each other.

16. The acoustic wave sensor device of claim 1, wherein the interdigitated transducer is split into two parts and further comprising an additional reflection structure positioned between the two parts.

17. The acoustic wave sensor device of claim 1, wherein the acoustic wave sensor device is a passive surface acoustic wave sensor device and/or an ambient parameter is one of a temperature, chemical species, strain, pressure or torque of a rotating axis.

18. The acoustic wave sensor device of claim 1, wherein the acoustic wave sensor device is a passive surface acoustic wave sensor device configured to sense an ambient parameter selected from among the group consisting of a temperature, a chemical species, a strain, a pressure, or a torque.

* * * * *